US012742818B1

(12) United States Patent
Tsironis

(10) Patent No.: US 12,742,818 B1
(45) Date of Patent: Sep. 22, 2026

(54) DYNAMIC LOAD PULL TUNER SUPPORT FOR ON-WAFER TESTING

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 154 days.

(21) Appl. No.: 18/626,404

(22) Filed: Apr. 4, 2024

(51) Int. Cl.
*G01R 31/28* (2006.01)

(52) U.S. Cl.
CPC ..... *G01R 31/2887* (2013.01); *G01R 31/2893* (2013.01)

(58) Field of Classification Search
CPC ........................ G01R 31/2887; G01R 31/2893
See application file for complete search history.

(56) References Cited

U.S. PATENT DOCUMENTS 7,102,457 B1 9/2006 Tsironis
7,135,942 B2 11/2006 Tsironis
8,933,707 B1 * 1/2015 Tsironis ............ G01R 31/2831 324/207.13
9,431,999 B1 8/2016 Tsironis
10,637,122 B1 * 4/2020 Tsironis .................... H03J 1/06
11,095,013 B1 * 8/2021 Tsironis ................. H02N 2/026
11,156,656 B1 * 10/2021 Tsironis ................. G01R 27/32
2002/0027434 A1 * 3/2002 Nordgren ........... G01R 31/2887 324/756.01

OTHER PUBLICATIONS

"Computer Controlled Microwave Tuner—CCMT", Product Note 41, Focus Microwaves Inc., Jan. 1998.

* cited by examiner

*Primary Examiner* — Dominic E Hawkins

(57) ABSTRACT

A dynamic support platform for on-wafer mounting load pull tuners with protruding airline allows: 1) THETA compensation, 2) contact control of the wafer probe with the chip and 3) balancing the tilting of the tuner caused by moving carriages. The platform has a front segment including a central traversal rotation point, a manual height adjustment device on one end and a counter spring on the opposite end, and a back segment including a central remotely controlled height adjustable post. The manual height adjustment device controls the planarization of the probe tips (THETA). The central post on the back segment determines the inclination of the tuner versus the wafer probe, controls remotely the contacting of the wafer probe with the chip on wafer and is automatically synchronized to compensate the differential vertical movement of the probe tips caused by tilting of the tuner due to the movement of the carriages.

9 Claims, 10 Drawing Sheets

FIG. 10A: Prior art
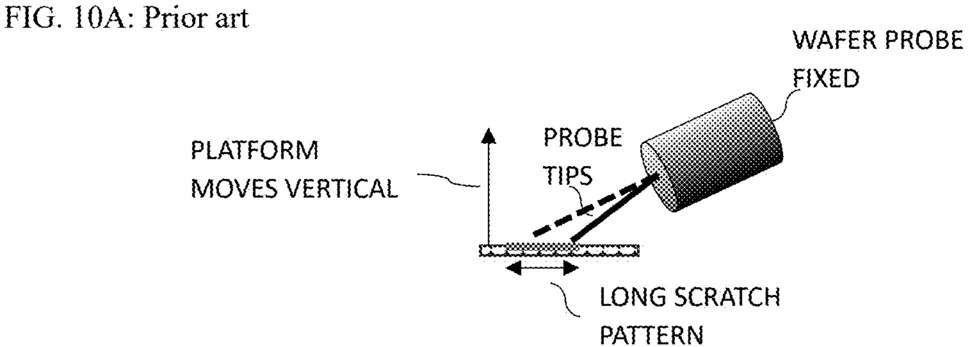
FIG. 10B
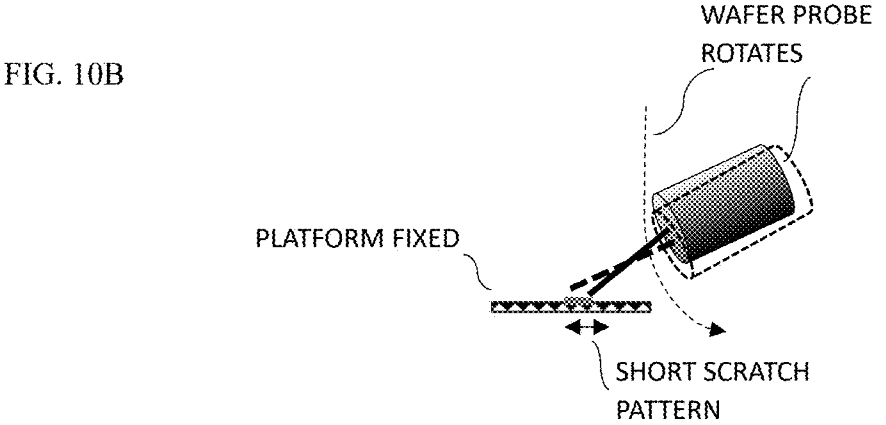

DYNAMIC LOAD PULL TUNER SUPPORT FOR ON-WAFER TESTING

PRIORITY CLAIM

Not Applicable

CROSS-REFERENCE TO RELATED ARTICLES

1. TSIRONIS, U.S. Pat. No. 7,102,457, “Mechanically balanced microwave load pull tuner”.
2. TSIRONIS, C. U.S. Pat. No. 9,431,999, “Intelligent Mechanical Balancing Apparatus for Slide Screw Tuner”.
3. TSIRONIS, C. U.S. Pat. No. 7,135,941, “Triple probe automatic slide screw load pull tuner and method”.
4. “Computer Controlled Microwave Tuner—CCMT”, Product Note 41, Focus Microwaves Inc., January 1998.

BACKGROUND OF THE INVENTION

This invention relates to alignment and dynamic arrangement used to operate wideband (single probe) and harmonic (multi-probe) passive slide screw impedance tuners on wafer probe stations in order to perform reliable load pull measurements of semiconductor chips. The arrangement ensures control of wafer probe contacting with the chips and reliable maintenance of the contact despite mechanical movement in the tuner during the measurement process.

PRIOR ART

A typical load pull measurement system (FIG. 1) includes a signal source 1, a source tuner 2, a test fixture 3 housing the DUT, a load tuner 4, and an output power meter 5. The tuners and the overall test system are controlled by a control computer 6, which is connected to the tuners using control cables 7, 8. Through digital commands from the computer the tuner’s motors position the tuner’s tuning probes appropriately and create impedances, which allow characterizing the DUT and through digital cables 9 the test instruments are configured and provide measurement data.

Electro-mechanical slide screw tuners 215 comprise, FIG. 2, a low loss transmission media for microwave energy (slotted transmission line or slabline) 24 with a test port 25 and an idle port 26; linked to the rigid air-line 24 are moving carriages 28 holding the microwave tuning probes 22, approaching the center conductor 23 and remotely controlled 20*a* electrical stepper motors 20, 27 ensure the horizontal 217 and vertical 216 movement of the carriages and the tuning probes using gear and screws 21, 29. For on-wafer measurements the tuner is placed on a tuner positioner, which has bearings or gliders allowing a 3-axis geometrical movement (X-Y-Z). The carriage 28 holding the reflective tuning probe (slug) comprises a housing, the precision vertical gear 21 and the vertical stepper motor 20 and weighs typically 1 kg.

BRIEF SUMMARY OF THE INVENTION

The massive mobile carriages of the tuner (see ref. 4) carrying the heavy vertical stepper motor and the high precision vertical axis, that control the tuning probes, move horizontally 83 along the slabline (FIG. 8); on a wafer test setup this causes the center of gravity of the tuner to move, the whole system to tilt and the wafer probe 81, which is connected directly on the tuner, to move up and down and risk to damage the device under test (chip) 84 and/or break the adjacent wafer probe tips 82. In the prior art (see ref. 1 and 2) a massive balancing weight is built either inside or attached from outside to the tuner and moved opposite to the move of the center of gravity thus keeping the tuner balanced and avoiding tilting and damage to the chips or probe tips.

This invention is not based on the prior art solutions (see refs. 1 and 2). Here any probe tip movement caused by tilting of the tuner and the attached wafer probe, caused by the movement of the total mass Σmi of all mobile carriages (see ref. 3), is simply compensated by a synchronous opposite tilting through adjustment of the support post 87, controlled using the actuator 86 or any other appropriate mechanism. The distinct difference with the prior art is that here the rotation point is a concrete pivot and not a virtual point somewhere inaccessible in the system. Here the rotation point 89 is at the front of the tuner base 88, where the base connects with the platform 85 of the probe station. At the same time, the base on which the tuner is mounted is compatible with manual traverse tilting 72 through rotation 78 around the pivot 73, to compensate of any microscopic manufacturing-caused probe-tip 75 misalignment @ against the semiconductor chip 76 as shown in FIGS. 7A and 7B.

BRIEF DESCRIPTION OF THE DRAWINGS

The invention and its mode of operation will be better understood from the following detailed description when read with the appended drawings in which:

FIG. 5A depicts a footprints of probe tips; FIG. 5B depicts front view of non-planar and planar probe tips.

FIG. 7A depicts the tuner base and planarization setup; FIG. 7B depicts the detail of the probe tips.

FIG. 10A through 10B depict contacting patterns of wafer probes with semiconductor chips: FIG. 10A depicts prior art, the entire platform of the wafer probe station is lifted to contact the immobile probe tips, and FIG. 10B depicts the herein disclosed method, where the platform is immobile, and the probe tips move down on an arc to meet the semiconductor chip.

DETAILED DESCRIPTION OF THE INVENTION

Figure 3:
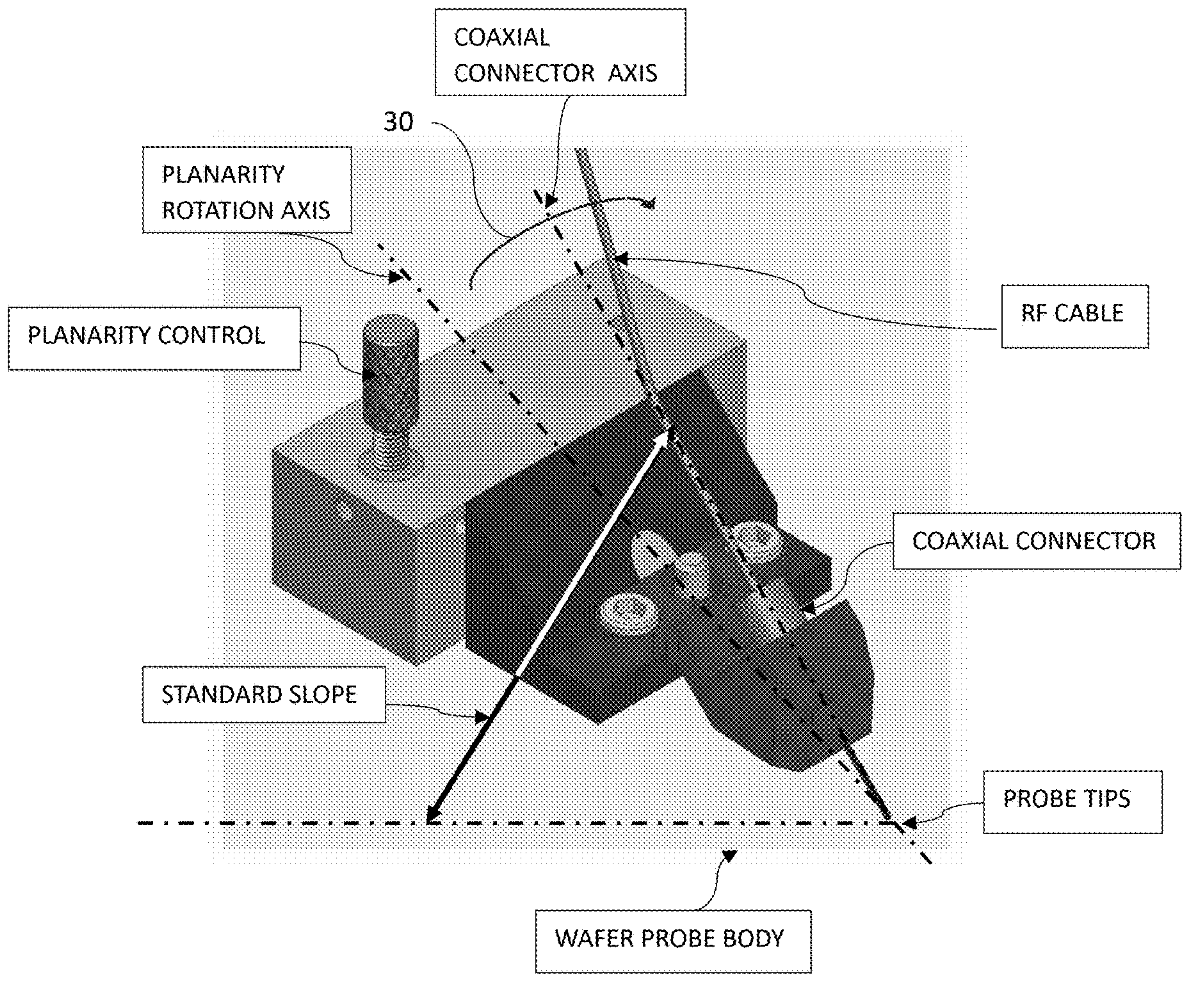
FIG. 3 depicts prior art, a wafer probe with structural details and the hitherto used method of controlling planarization Θ of wafer probes connected to flexible cables and not directly to tuners.

The support base carrying the tuner ensures two major functions: A) a static one and B) a dynamic one: A) the static capability offers manual planarization of the probe tips; the context is demonstrated in FIGS. 3 through 5 and partially in FIG. 7B; FIG. 3 shows all relevant properties of a wafer probe with prior art planarization capacity. Two items are important: 1) the standard slope: this is the angle between the axis of the coaxial connector and the ground plane (or wafer plan); this angle determines the slope of the base 88 and the tuner 80 and therefore the starting value of the dynamically controlled length of the stab 87; and 2) the planarity of the probe tips: typical wafer probes are based on the coplanar transmission concept: a coaxial transmission line 40 leads to a central signal conductor and two ground conductors 41, or GSG, FIG. 4, contacting the plots 43, 44 of the chip 42; a method to judge the planarity of the probe tips is demonstrated in FIGS. 5A and 5B by observing if the marks of the plots 51, 52 are different as 50 versus 53 in which case the angle THETA (Θ) (FIG. 5B) is either larger than zero or zero. This non-planarity is a small manufacturing default for which the planarization method offers a manual static correction as shown in FIG. 3.

A further particularity of the static function of the support base, beyond the capacity to arrange for a planarization rotation around the planarity rotation axis of the probe tips, is the capacity to, simultaneously, allow for a perfect alignment and direct connection of the coaxial connector of the wafer probe with the coaxial connector 65 of the test port of the tuner. This means that the small static rotation of maximum ±5° around the pivot 73, required by the wafer probe manufacturers, causes a movement on the arc 30 of the tuner and the base. This means the elaborate planarization mechanism of FIG. 3 is not required; instead, the central post 87 at the back front of the base must tolerate the small static rotation of the angle correction THETA.

Figure 6:
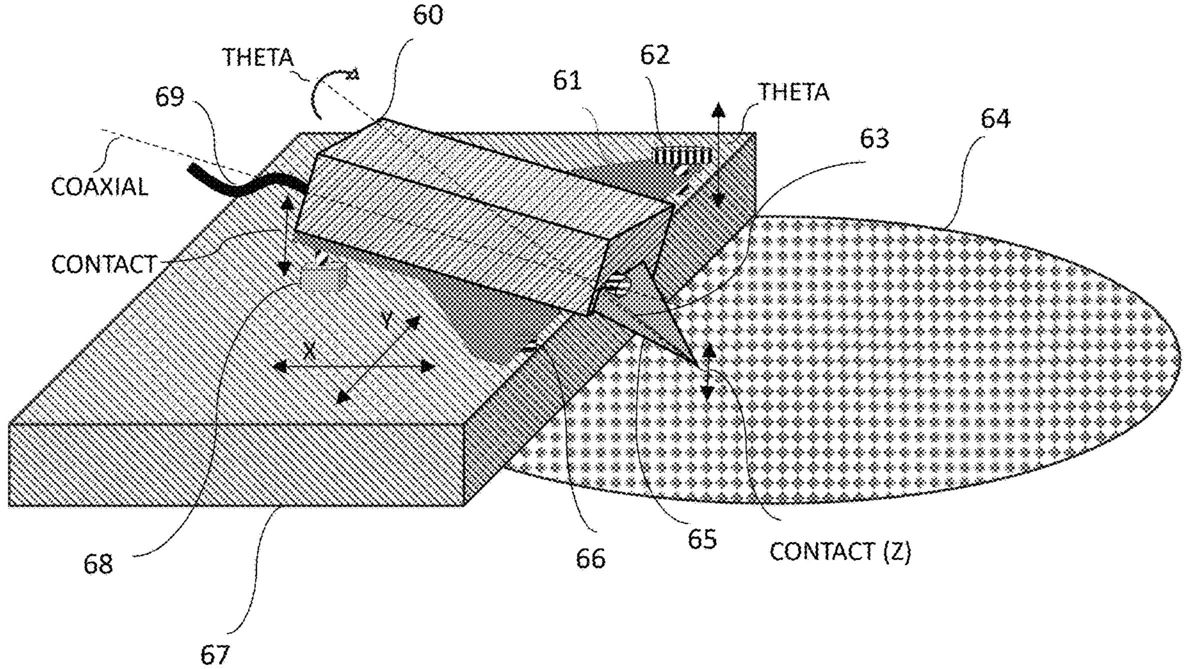
FIG. 6 depicts a perspective view of the base supporting the tuner under a slope on a wafer probe station.

FIG. 6 shows the overall arrangement: the tuner 60 is mounted on the base 61 which is anchored at the platform 67 of the wafer probe station which holds the semiconductor wafer 64 and can move it horizontally in X and Y direction underneath and parallel to the platform 67 to position a chip under the probe tips. Since the invention also provides for the required quantum in vertical movement of the remotely controlled actuator 68 allowing to make or interrupt the electrical contact of the probe tips with the chip on the wafer 64, the additional benefit of the dynamic tuner base is supporting a much simpler wafer probe station without remote vertical (Z) control of the wafer (compact, wiggle-free vertical movement is a difficult mechanical endeavor). In order to support the static THETA (Θ) rotation controlled through the screw 62 and alternative counter means, such as the counter spring 66, around the test port protrusion 65 leading to the probe-tip axis 63, the output port of the tuner must be connected with the accessory equipment using a flexible RF cable 69.

Figures 7A, 7B:
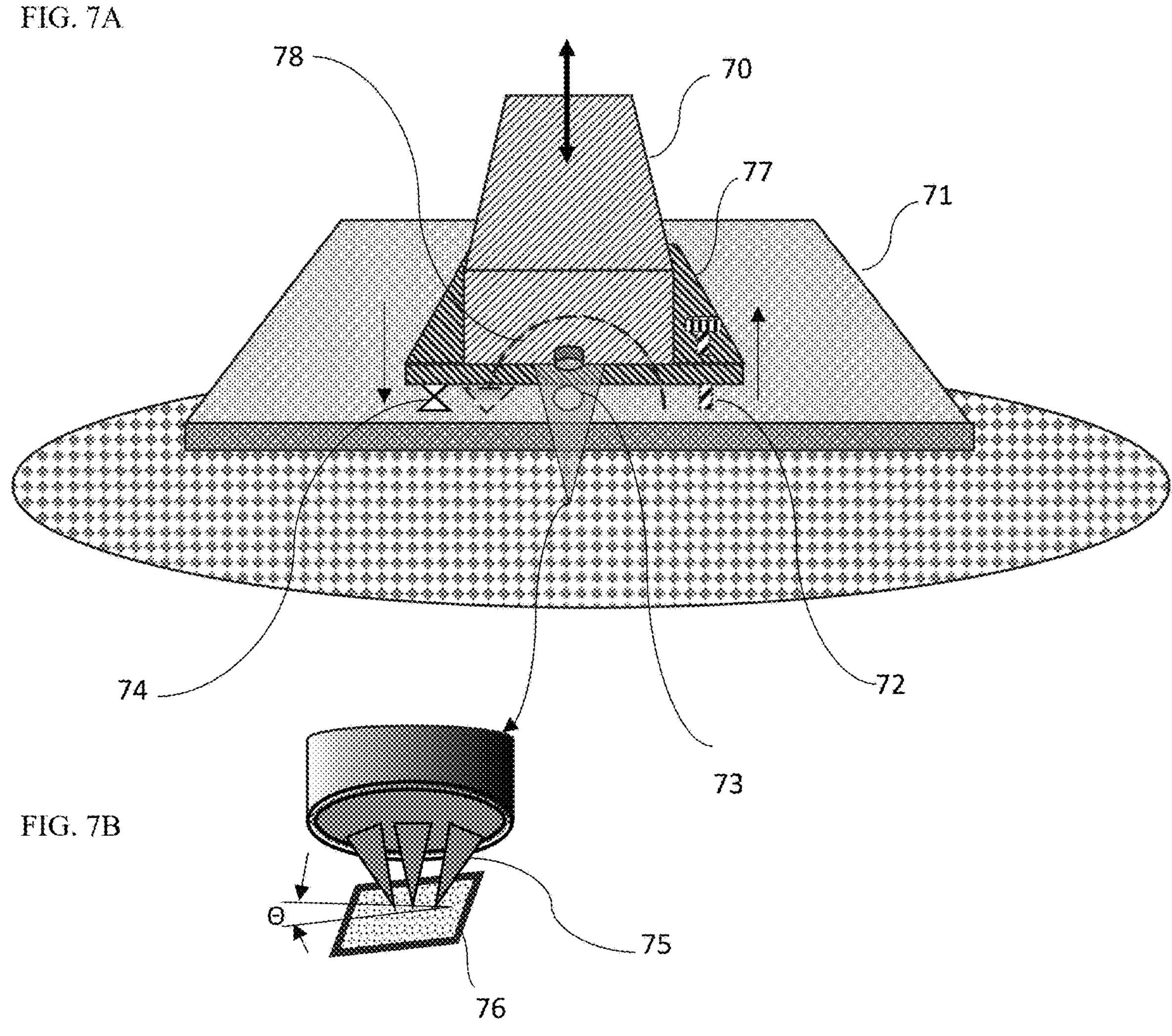
FIG. 7A through 7B depict a front view of the tuner on wafer.

The THETA control is better visible in FIG. 7: The base 77 rotates with the tuner 70 around the pivot point 73 versus the platform 71; the angle THETA (Θ) is controlled via item 72 (screw) and item 74 (as an example a counter compression spring); FIG. 7B depicts the detail of the wafer probe tips and the definition of the planarization angle THETA (also FIG. 5). The spring 74 solution is preferrable to a counter set-screw alternative, since the last one requires an alternative back and forth adjustment, before reaching a final state. Once set, the planarization remains constant, it is therefore the static component of the tuner support.

Figure 8:
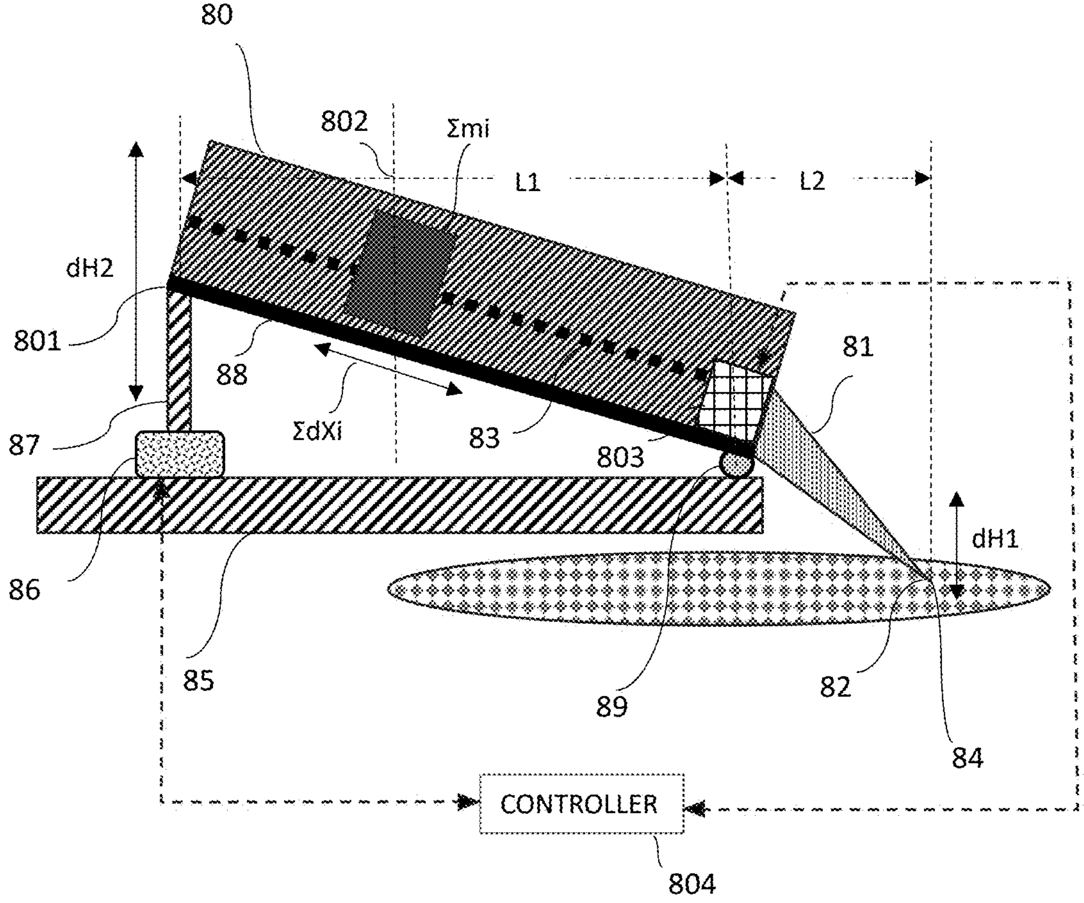
FIG. 8 depicts the balancing setup.

The actual dynamic function B), of the invention is demonstrated in FIG. 8: we have a balanced system rotating around a fixed axis (pivot) 89. The mass MT of the tuner 80 exercises a momentum MT*L1 versus the overall mass of the test port extension and the wafer probe MW designated as item 81, creating a counter momentum MW*L2. If, at any point of time "t" a free system becomes unbalanced, i.e., MT(t)*L1≠MW*L2, even if this is temporary, this will cause the probe tips 82 to lift or descend, with a serious risk of damage or contact instability and false results. Imbalance is created when the carriage(s) in the tuner move, while the probe tips are contacting the wafer chip; this phenomenon is evident considering that the position 802 moves with ΣdXi with the resulting mass of all carriages together Σmi. This means dXi can be positive (move away from the test port) or negative (move towards the test port); what matters is the algebraic sum (net) of the movements of the masses, since this is how the center of gravity of the tuner moves. The fact that the base 88 is supported at two points 89 and 801 renders the system less sensitive than the floating balancing system in ref. 1 and 2, but still in a transition period of time accelerating/decelerating the carriages and the counter support 87 should be synchronized. This can be accurately accommodated by the controller 804, which controls the actuator 86 directly and the carriages mi via the motor control board 803; the control software uses linear interpolation between and extrapolation beyond calibrated points. The fact that L1 is much larger than L2 and the fact that the horizontal component of the movement of the carriages ΣdXi is smaller than the movement itself improves the resolution of the system; for instance, if the slope is, typical, 45° and the ratio L1/L2 is around 10, then the ration is dH1≈dH2/15; in terms of dH1 the tolerance is ±5 μm or in terms of dH2 it is required to have a vertical resolution of at least ±75 μm, a relatively easy task, corresponding to a typical fine thread of the post 87 and average step size of the actuator 86.

Figure 1:
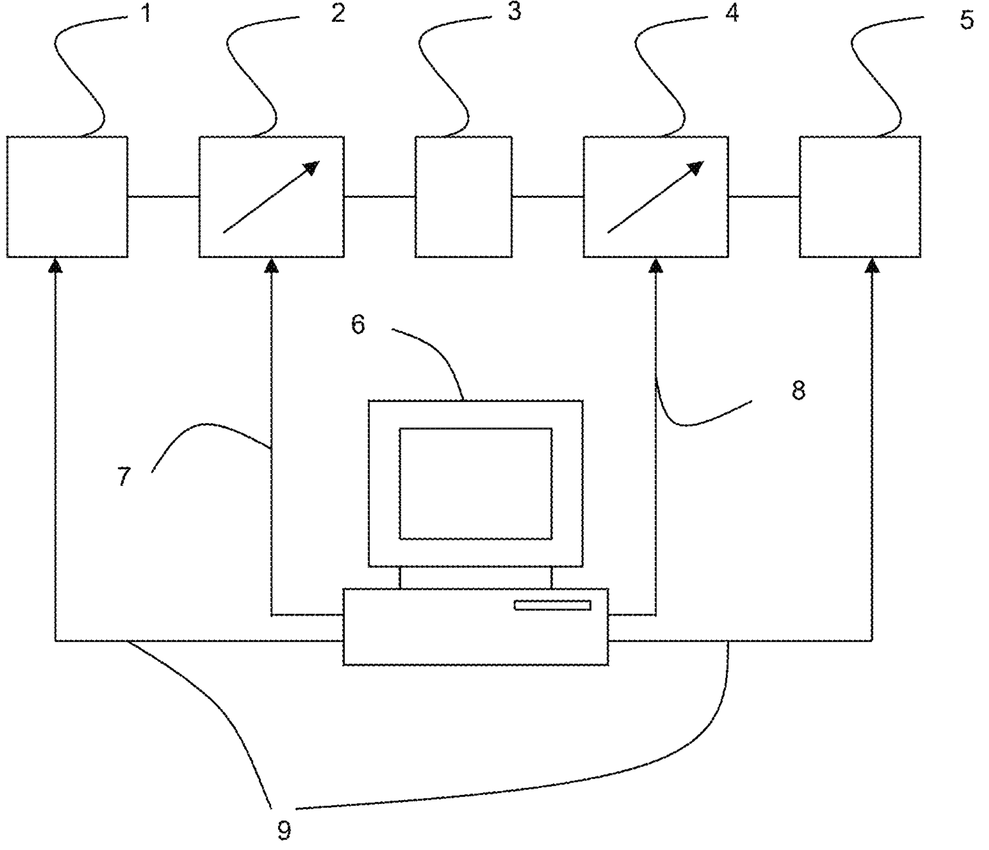
FIG. 1 depicts prior art, a block diagram of a load pull measurement setup, in which electro-mechanical impedance tuners are used to manipulate the source and load impedances presented to the DUT.
Figure 2:
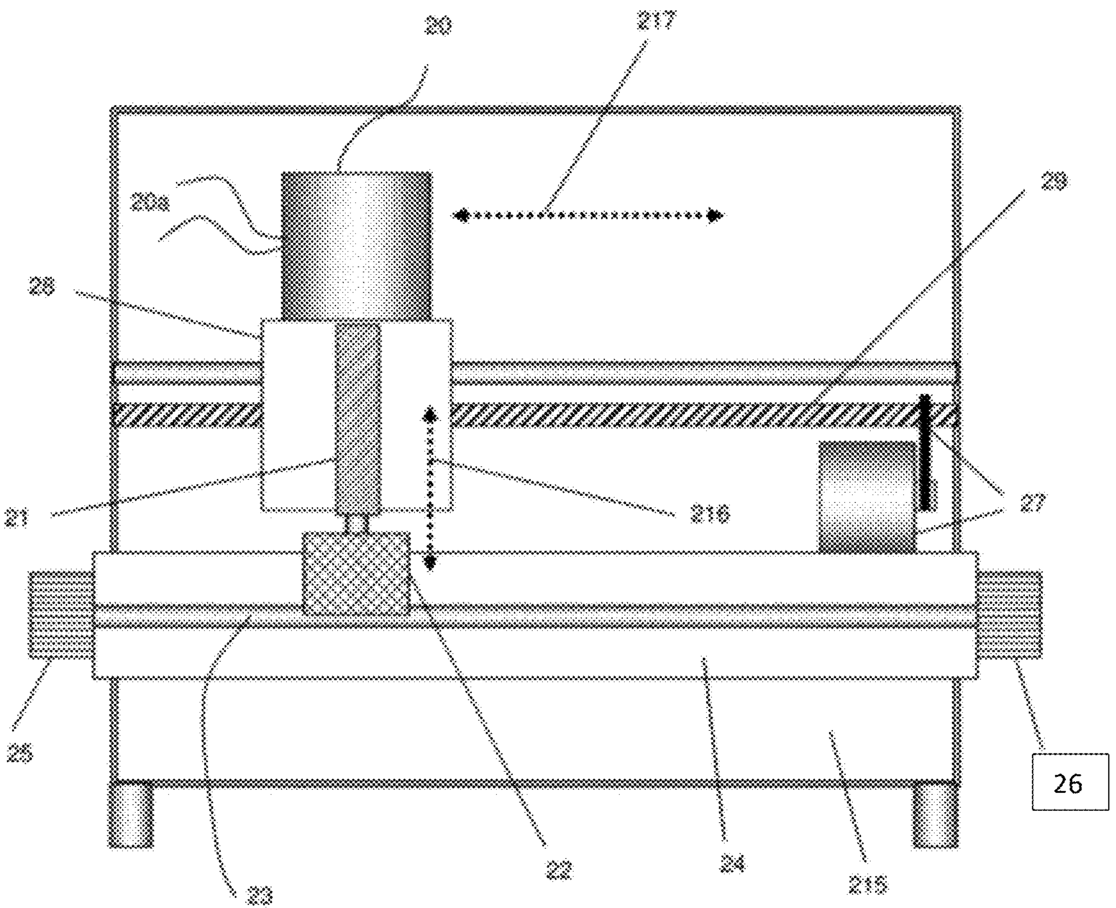
FIG. 2 depicts prior art, a front view of a single carriage electro-mechanical slide screw tuner.

In all cases it is only the horizontal component of the movement speed of the carriages that matters in calculating the balancing conditions. This is, also, why the vertical movement of the tuning probes is irrelevant in the balancing process: in case the tuner is mounted flat and not sloped, the horizontal speed component of the vertically moving tuning probe is zero, and, if the tuner is mounted sloped, as is here the case, the short vertical movement (FIG. 2) of the tuning probe and its small mass renders its contribution negligeable as well.

Then there is the acceleration-deceleration phase: in order to avoid sudden shocks and sudden tilting of the system, the stepper motors controlling the gear moving the carriages and the vertical actuator are ramped up from standing to their normal rotating speed and back, which, in view of the specified required torque and possible self-resonance of the coils is, typically and conservatively, 200 steps/sec at 1.8°/step or 1 rotation i.e., 360°/sec. This rotation is translated, via the appropriate gear (belt, pulley, ACME screw . . . ) to horizontal (and vertical) move (i.e., ΔX/step or ΔH/step) of the mobile carriage(s) and the vertical post 92. The concern here is only horizontal movement because this affects the position of the center of gravity of the system. During the ramping up or down, since the starting speed is =0, in case of adjustable speed care is taken the ramping to always last the same time.

Figure 9:
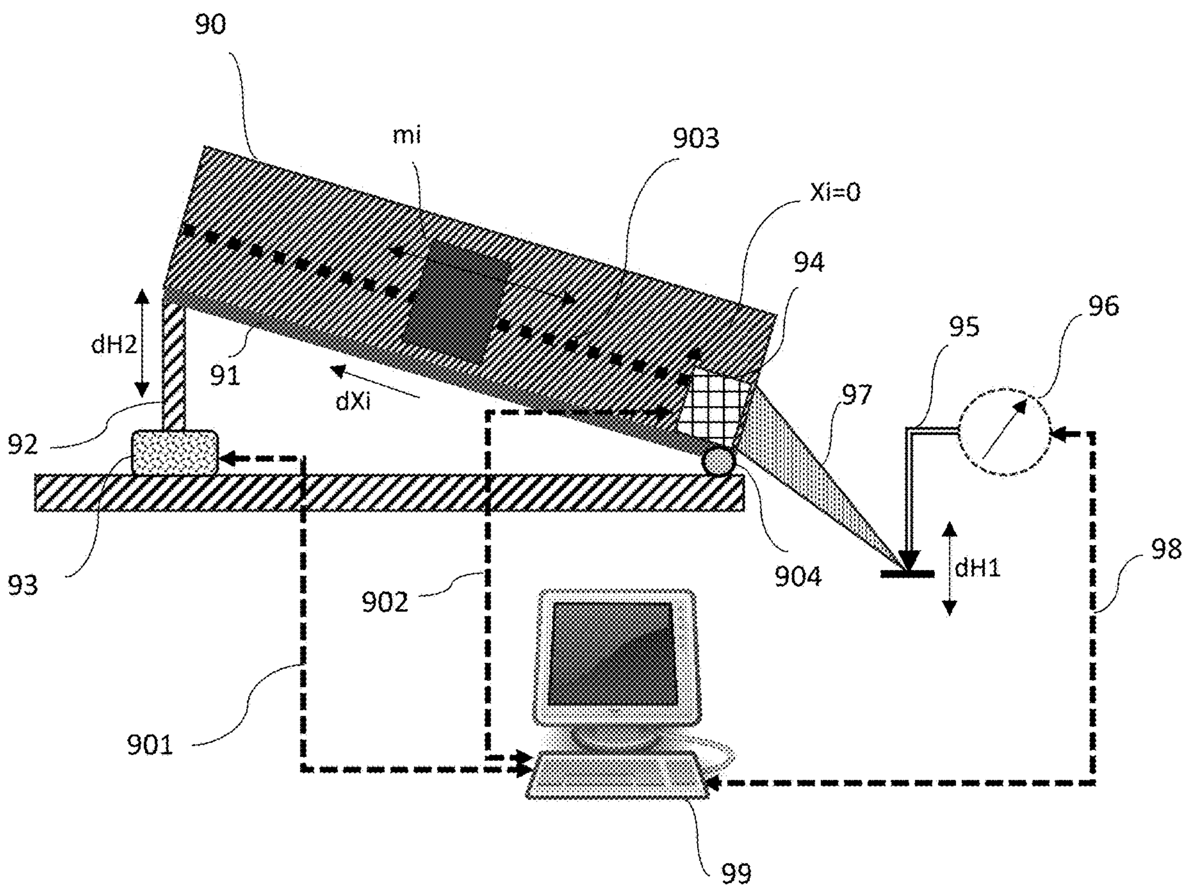
FIG. 9 depicts an automatic calibration setup for the determination of the correction factor CFi of a carriage “i”.

The calibration of the dynamic support is automated using the setup of FIG. 9: the carriages are controlled by the electronic board 94 which communicates 902 with the control computer 99 and moves the carriage mass mi via the ACME screw 903 and also controls 901 the vertical actuator 93 and reads 98 the indicator 96 which detects directly 95 the vertical dH1 movement of the probe 97 tips, created by rotation of the tuner body 90 around the rotation axis 904. Changing the slope of the base 91 which supports the tuner 90 modifies dH2 via the post/screw 92 and counters the effect of the movement dXi of the masses mi to return dH1 back to zero. Overall, the system is linear, which means we can calibrate for the movement dXi of each mass mi and apply this to the algebraic sum all the masses Σmi and all the movements ΣdXi for 1≤i≤N, whereby N is the number of carriages. This method has the advantage that it does not assume the masses to be equal, or the carriages to move at the same speed, or the base or the platform to be completely rigid. Within the obviously valid, linearity conditions of the arrangement, a linear interpolation from Xi to Xi+dXi is valid and this is valid also during the ramping up and down of each carriage.

The calibration of the support arrangement, using the setup of FIG. 9, yields movement correction factors for each carriage: CFi=dH2.*i*/dXi, which, due to the presumed mechanical linearity of the overall arrangement, is valid for the entire length of the travel of each carriage "i" from the closest position to the test port possible (Xi=0) to the farthest one Xi.max, which is one half of a wavelength (λ/2) at the lowest frequency of operation Fmin, or in formulae: CFi (Xi)=const.; this means, a control mechanism which links the total net movement of all carriages ΣdXi to the vertical correction dH2=Σ(CFi*dXi) at any instant "t" ensures vertical stability of the wafer probe tips. This solves the "balancing" issue of the arrangement.

The additional benefit of the arrangement concerns the contacting of the probe tips with the chip on wafer. Hitherto solutions in industry keep the vertical position of the wafer probes fixed. To switch from one chip to the next, the overall wafer is lowered in Z direction, moved in X,Y direction and lifted again to the previous level. Those skilled in precision mechanics know the complexity of planar vertical movement of a big platform. The solutions range from synchronized motors driving vertical screws, to wedge inserts pushed simultaneously under the platform to circular belts driving vertical pulleys screwed on vertical screws; in any case the solutions are at least cumbersome. All this is in order to avoid lifting and lowering the wafer probes. The proposed arrangement bypasses the problem by controlling with very high precision the vertical movement of the wafer probes, via the actuator 93 and the post 92. The system is calibrated best visually: the contact of the probe tips with a chip on wafer is observed under a microscope, when the contact is securely established, the setting of the actuator is saved as H2.ON, then the actuator is directed to lower the back of the tuner 90, until a safe distance to the wafer is established, and the new position is marked H2.OFF. Toggling between H2.ON and H2.OFF, at any position Xi of the carriages, establishes the desired contact control. In this case the wafer itself or the platform 85 remain vertically stable and only a planar X, Y movement of the wafer is needed to move to testing new chips.

Figure 4:
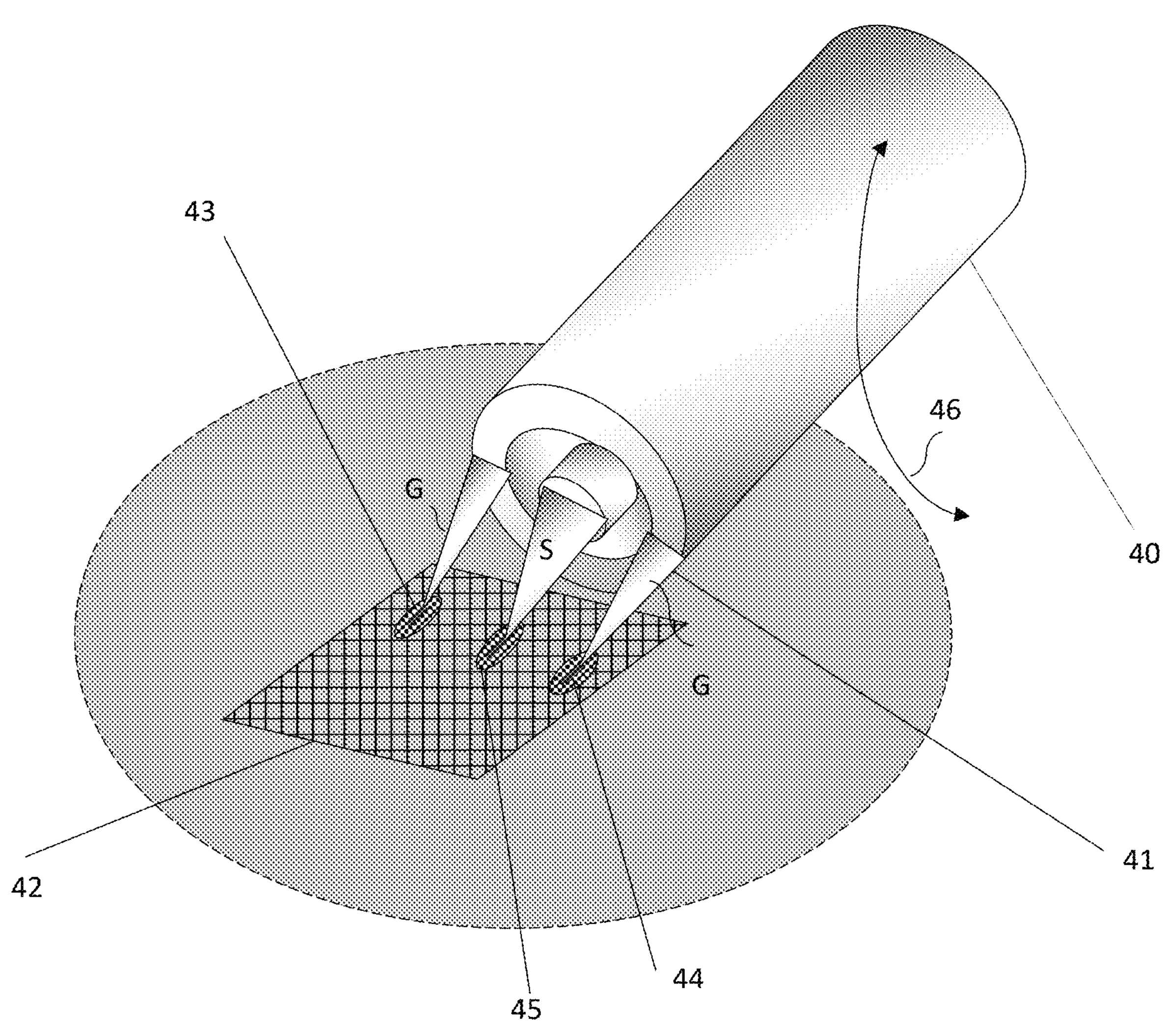
FIG. 4 depicts prior art, detail of wafer probe tips.
Figure 5:
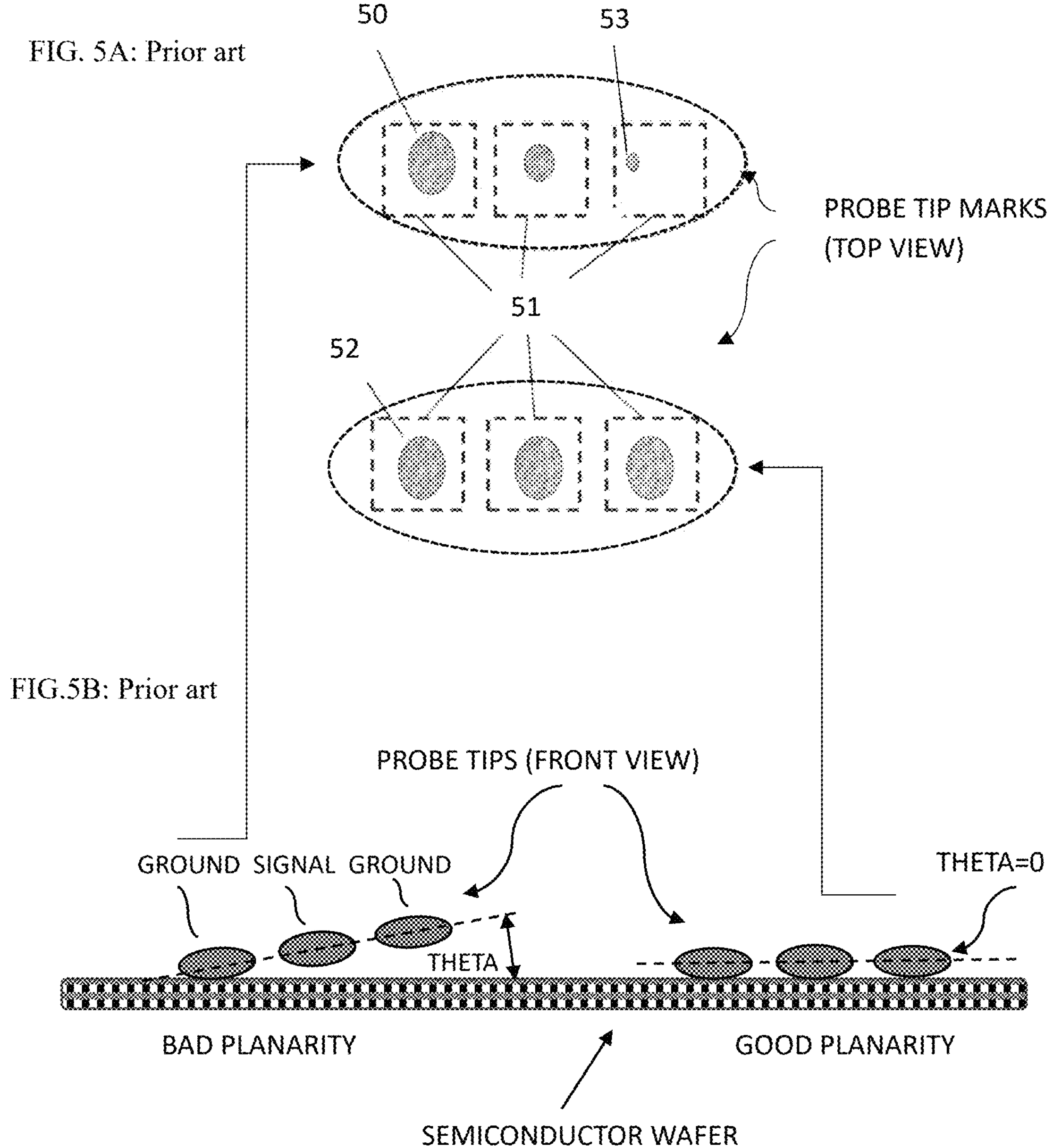
FIG. 5A through 5B depict prior art, planarization of wafer probes.

An easy to miss, intrinsic, benefit of the proposed apparatus and solution is the fact that, in the present disclosure, other than in prior art, the microscopic scratching of the probe tips on the chip, when the wafer probe, which is an extension of the coaxial cable 40, moves on an arc 46 around the pivot 89 during the descending movement to secure the contact, it simultaneously shortens the scratching marks 44 on the contact plots 43, 45 of the chip (FIG. 4). These are caused by the existing elasticity of the probe tips 41 as they bend up caused by the downward movement of the wafer probe. This is also visualized in FIGS. 10A (prior art) through 10B (actual apparatus).

The invention has been disclosed based on a preferred embodiment. Obvious alternative configurations and embodiments of the compensation mechanism shall not impede the reach of the invention. Obviously modified or re-arranged algorithms for determining the movement correction factor CFi and countermove control mechanism shall not impede on the general scope of the concept.

What is claimed is:

1. A dynamic tuner support arrangement for on-wafer load pull testing comprising:

a remotely controlled inclined base supporting the tuner, means for correction of planarity misalignment of a wafer probe, and remotely controlled contact of a wafer probe with a DUT on-wafer including automated compensation of a vertical movement of the wafer probe caused by an internal tuner movement (synchronous balancing);

wherein the remotely controlled inclined base has a front segment and a back segment and is mounted on a platform of a wafer probe station, and wherein the tuner is mounted permanently on the remotely controlled inclined base and comprises a slabline and at least one remotely controlled mobile carriage moving along the slabline and has a protruding test port towards the front segment of the remotely controlled inclined base, said test port being connected directly with a coaxial connector of the wafer probe, which has a standard slope and probe tips with a rotation axis, and wherein the remotely controlled inclined base is mounted on the platform of the probe station under an angle matching the standard slope of the wafer probe wherein the front segment of the remotely controlled inclined base is connected with the platform at three points: a central pivot, a manual height adjustment device on one side, and a counter control on the opposite side, allowing adjustment of probe tip planarization (THETA);

and wherein the back segment of the remotely controlled inclined base is elevated compared with the front segment of the base at remotely controlled adjustable height.

2. The dynamic tuner support arrangement of claim 1 wherein the central pivot has a rotation axis which matches the rotation axis of the probe tips of the wafer probe and allows tilting of the remotely controlled inclined base.

3. The dynamic tuner support arrangement of claim 1 wherein the remotely controlled height adjustment on the back segment of the remotely controlled inclined base controls establishing or interrupting an electrical contact of the probe tips with the DUT on-wafer.

4. The dynamic tuner support arrangement of claim 1 wherein the remotely controlled height adjustment on the back segment of the remotely controlled inclined base compensates for a vertical movement of the probe tips caused by movement of the at least one carriage of the tuner.

5. The dynamic tuner support arrangement of claim 1 wherein the height adjustment device on the back segment of the remotely controlled inclined base is controlled by a remotely controlled linear actuator.

6. A calibration method for the dynamic tuner support arrangement of claim 1 comprising:

a) attach an indicator at the probe tips;

b) move a carriage "i" (i=1, 2, 3 . . . ) of the tuner by a length dXi away from the test port, and c) increase the height H on the back segment of the remotely controlled inclined base by dHi to keep the probe tips at constant level;

d) calculate a correction factor for carriage "i" as CFi=dHi/dXi;

e) repeat steps b) to d) for all carriages.

7. A contacting method for the dynamic tuner support arrangement of claim 1, wherein the height of the back segment of the remotely controlled inclined base is changed as follows:

a) from a non-contacting state: increased by an amount H2.ON to establish a contact, or b) from a contacting state: decreased by an amount H2.OFF=H2.ON to interrupt the contact.

8. A balancing method for the dynamic tuner support arrangement of claim 6, wherein for an instantaneous sum ΣdXi of movements of N carriages of the tuner, increase the height H of the back segment of the remotely controlled inclined base by a total of Σ(CFi*dXi) for 1≤i≤N.

9. The dynamic tuner support arrangement of claim 1 wherein the counter control on the opposite side of the front segment of the remotely controlled inclined base is a compression spring.

* * * * *